(12) United States Patent
Shipe et al.

(10) Patent No.: US 6,655,976 B1
(45) Date of Patent: Dec. 2, 2003

(54) ELECTRICAL CONNECTOR

(75) Inventors: Joanne E. Shipe, Harrisburg, PA (US); Po-Ning Sun, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/306,283

(22) Filed: Nov. 26, 2002

(51) Int. Cl.[7] .................................................. H01R 9/09
(52) U.S. Cl. ...................................... 439/328; 439/325
(58) Field of Search ................................ 439/325, 327, 439/328, 79, 80, 630, 629, 358

(56) References Cited

U.S. PATENT DOCUMENTS

| | | | | |
|---|---|---|---|---|
| 4,006,955 A | * | 2/1977 | Johnson | 439/327 |
| 4,192,478 A | * | 3/1980 | Coules | 248/220.31 |
| 5,494,451 A | * | 2/1996 | Bowers | 439/328 |
| 6,045,386 A | * | 4/2000 | Boe | 439/327 |
| 6,358,079 B1 | * | 3/2002 | Noble | 439/328 |

* cited by examiner

*Primary Examiner*—Hien Vu
(74) *Attorney, Agent, or Firm*—Wei Te Chung

(57) ABSTRACT

An electrical connector (1) comprises an elongated housing (10) and a mating groove (11) formed on one surface of the housing (10) to receive a leading edge of a extension daughter card (4) so as to electrically connect the card (4) to a printed circuit board (3) where the connector (1) is seated. A plurality of passageways (12) having signal conductors (2) installed therein is formed in two sidewalls of the mating groove (11). A ridge-shaped support mechanism (13) projects from one side surface of the housing (10) and is located abutting against one lengthwise edge of the surface having the mating groove (11). A plurality of recesses (14) in a row is formed inside the support mechanism (13) to prevent the sidewall of the housing (10) from warping in the forming process of the housing (10) and make the support mechanism (13) extending continuously along the whole length of the connector (1) so that a clip (5) attached on the card (4) for retention can be freely disposed on any location along the length of the connector (1) to fix the card (4) onto the connector (1).

1 Claim, 5 Drawing Sheets

ELECTRICAL CONNECTOR

BACKGROUND OF THE INVENTION

1. Field of the Invention

The present invention is related to an electrical connector having rows of conductors to receive an edge of a printed circuit board and electrically connect thereto by means of the conductors, especially to an electrical connector having a support portion for the retention of the printed circuit board the connector is connected to.

2. Description of the Related Art

After years of development, the computer industry becomes more and more technically mature and competitive. The leading trends of manufacturing any computer-related products include cheap prices, compact size, light weight and customer orientation. Especially, functions of these computer-related products are renewing and freshening quickly and new-developed technology usually changes the main need to these products. 3-Dimention graphic technology and wireless communication are the most famous examples to explain the changes. Therefore, in order to seek the balance of the product price and orientation of the specialized customer need, functional extension devices are always designed in all kinds of these products, like PCI (Peripheral Component Interconnect) and AGP (Accelerated Graphics Port) extension slots of desktop computers, PCM-CIA card and memory extension slots of laptops, and storage card slots of digital cameras, etc. In some computer equipment, extension card slots are provided by a plurality of card edge connectors, which are usually mounted on a motherboard of the computer equipment in a parallel relationship and arranged close to the peripheral connection port panel set at the back of the computer chassis. Usually every extension daughter card with a leading edge inserted into the slot of the corresponding connector has a complementary panel piece mounted on another edge adjacent to the leading edge of the card. Screws can be used to fix the card to the port panel with the complementary panel piece. Therefore, in the situation of shipping, moving the computer equipments or vibration, the screwed complementary panel piece of the card will provide enough supporting force to hold the card in its original connection position with the card edge connector. However, only a very small, restricted area on the motherboard is available for use and is prior to be utilized by the extension daughter cards which has to connect with necessary peripheral devices, like graphic cards connecting to monitors, etc. And precise mounting positions for the motherboard and connectors thereon become very important for designing so that the complementary panel piece of the extension card can reach the panel of the chassis to be fixed thereon. Especially, as shown in FIG. 5, in some computer architectures, a functional riser card is used to connect with more extension cards due to the horizontal parallel arrangement of the cards, which are difficult to be locked by the same method mentioned above.

Therefore, in U.S. Pat. Nos. 3,573,706, 3,970,353 and 4,006,955, a locking clip installed inside a connector is introduced to fix the extension card to the connector when the card is inserted into a mating slot of the connector. And the clip can further be locked on the motherboard if it is necessary. Other mechanisms introduced in U.S. Pat. Nos. 3,216,580, 4,198,024 and 5,660,557 show an additional locking part is provided by the motherboard where a connector is mounted so that the mating extension card of the connector can be fixed by the preset locking part. Similar examples can be found in the applications of AGP connectors, as shown in U.S. Pat. No. 6,045,386, and CPU (Central Process Unit) integrated card connectors, as shown in U.S. Pat. No. 5,650,917. Providing additional locking parts obviously costs more than other applications. Thus, as introduced in U.S. Pat. Nos. 4,781,612, 4,713,013 and 6,368,124, an integrated connector having locking latches formed thereon is provided to fix a mating card at the same time when the card is mated with the connector. Apparently, methods introduced above show their own effective ways to fix extension card to their mating connectors so as to ensure the successful electrical connection between the cards and connectors. However, most of them also show undesired restrictions to the size of extension cards, positions of holes or recesses formed in advance on extension cards and specialized installation for latching parts. For example, the length of an extension card mated with a connector has to equal the distance between two branches of a specialized latching mechanism. Almost all of these methods need some corresponding features, like holes, recesses, etc., disposed at predetermined portions of extension cards. The result of the inflexible arrangement to these corresponding features sometimes affects the arrangement of the components or circuitry on the same extension cards.

Referring to FIG. 4, recently a quite different arrangement for card retention is developed. A card edge connector 1 mounted on a printed circuit board 3, usually a motherboard, has an elongated parallelepiped housing 10 and a mating groove formed thereon to receive a leading edge of a card 4. And a ridge 13 with a triangular section projects from one side surface of the housing 10 and near one lengthwise edge along the top surface of the housing 10. Besides, a retention clip 5 having a holding post 51 extending from the upright standing body 50 of the clip 5 is attached to the card 4 in advance by using its post 51 inserted into and through a hole (not shown) defined on the card 4. It is understandable the hook shaped edge 52 formed at the bottom of the body 50 can be latched on the ridge 13 of the connector housing 10 when the card 4 attached by the clip 5 is mated with the connector 1. Due to the retention ridge 13 extending along the length of the connector housing 10, the bottom edge 52 of the clip 5 can be hooked on any portion of the ridge 13 along the connector 1. Therefore, either the size of the card 4 or the setting position of the hole on the card 4 becomes flexible and changeable so as to make the card design much easier. And the size or width of the clip 5 can be changeable and flexible too because the clip 5 can be latched on the connector 1 regardless of the place where the clip 5 falls along the length of the connector housing 10.

However, forming a solid ridge on the originally thin side wall of the connector housing is a difficult job. When the melted raw material is injected into a mold to form the housing with the ridge, fibers gradually formed inside the housing or ridge in the cool-down forming process are usually uniformly arranged along the lengthwise direction of the housing. The uniform arrangement for the housing material generates a strong and undesired inner stress applying on the thin side wall of the housing and usually make the wall become warped. Referring to FIG. 6, a solution is considered to avoid the above situation. A card edge connector 6 has a housing 60 with contacts 61 installed therein. A mating groove 62 is formed on one side of the housing 60 to receive the leading edge of a card and contacts 61 inside the housing can be electrically engaged with the card in the groove 62. A plurality of serrations 63 arranged in a row is formed on another side of the housing 60 along the length of the housing 60 and adjacent to the side with the mating groove 62. Obviously, the injected forming material of the housing 60 cannot be arranged uniformly anymore due to the discontinuous serrations 63. That reduces the risk of getting a warped housing. But unfortunately, the serration structure of the housing 60 reduces the strength of the housing wall at the same time. In some violent shaking shipment environments, the vulnerable wall of the connector housing is easily crushed due to the possible shaking of the mating card inserted onto the connector. Especially, in the riser card application as show in FIG. 5, the retention of a riser card 7 becomes much difficult when the riser card 7 has some edge connectors 72 mounted on it to connect or carry with more functional daughter cards 73. The edge connector 71 for connecting the riser card 7 to the motherboard 3 has to build the ability to resist the possible vibration force when the unbalance arrangement is in the vibrating circumstance. Besides, the hook-shaped bottom of the clip 5 should be wider than the interval of every two serrations so as to have the clip 5 successfully latched on any serration. This is an unnecessary limitation for manufacturing of the clip 5.

SUMMARY OF THE INVENTION

Therefore, an object of the present invention is to provide an electrical connector for electrical connecting to an extension daughter card having a strengthened support mechanism for any retention clip so that the card can always be fixed tightly to the connector after mating by the clip for a long-termed use.

Another object of the present invention is to provide an electrical connector having a continuous support mechanism along the length of the connector so that the size and location of the mating card and the retention clip can vary according to the actual need of product design and manufacturing.

Another object of the present invention is to provide an electrical connector with improved structure which can overcome any possible problem during the processes of manufacturing.

To obtain the above objects, an electrical connector in accordance with the present invention includes comprises an elongated housing and a mating groove formed on one surface of the housing to receive a leading edge of a extension daughter card so as to electrically connect the card to a printed circuit board where the connector is seated. A plurality of passageways is formed in two sidewalls of the mating groove in a row inside every sidewall respectively. Signal conductors are installed into the passageways respectively and each signal conductor has an engaging portion to fix the conductor in its corresponding passageway, a resilient contacting portion for electrical connection between the connector and the card, and a tail portion extending out of the passageway for a through-hole connection with the printed circuit board.

Specially, a ridge-shaped support mechanism projects from one side surface of the housing and is located abutting against one lengthwise edge of the surface having the mating groove. A plurality of recesses in a row to provide empty space is formed inside the support mechanism to prevent the sidewall of the housing from warping in the forming process of the housing and make the support mechanism remaining its continuous extension along the whole length of the connector so that a clip attached on the card for retention can be freely disposed on any location along the length of the connector to fix the card onto the connector.

Other objects, advantages and novel features of the invention will become more apparent from the following detailed description of the present embodiment when taken in conjunction with the accompanying drawings.

DESCRIPTION OF THE PREFERRED EMBODIMENT

Figure 1:
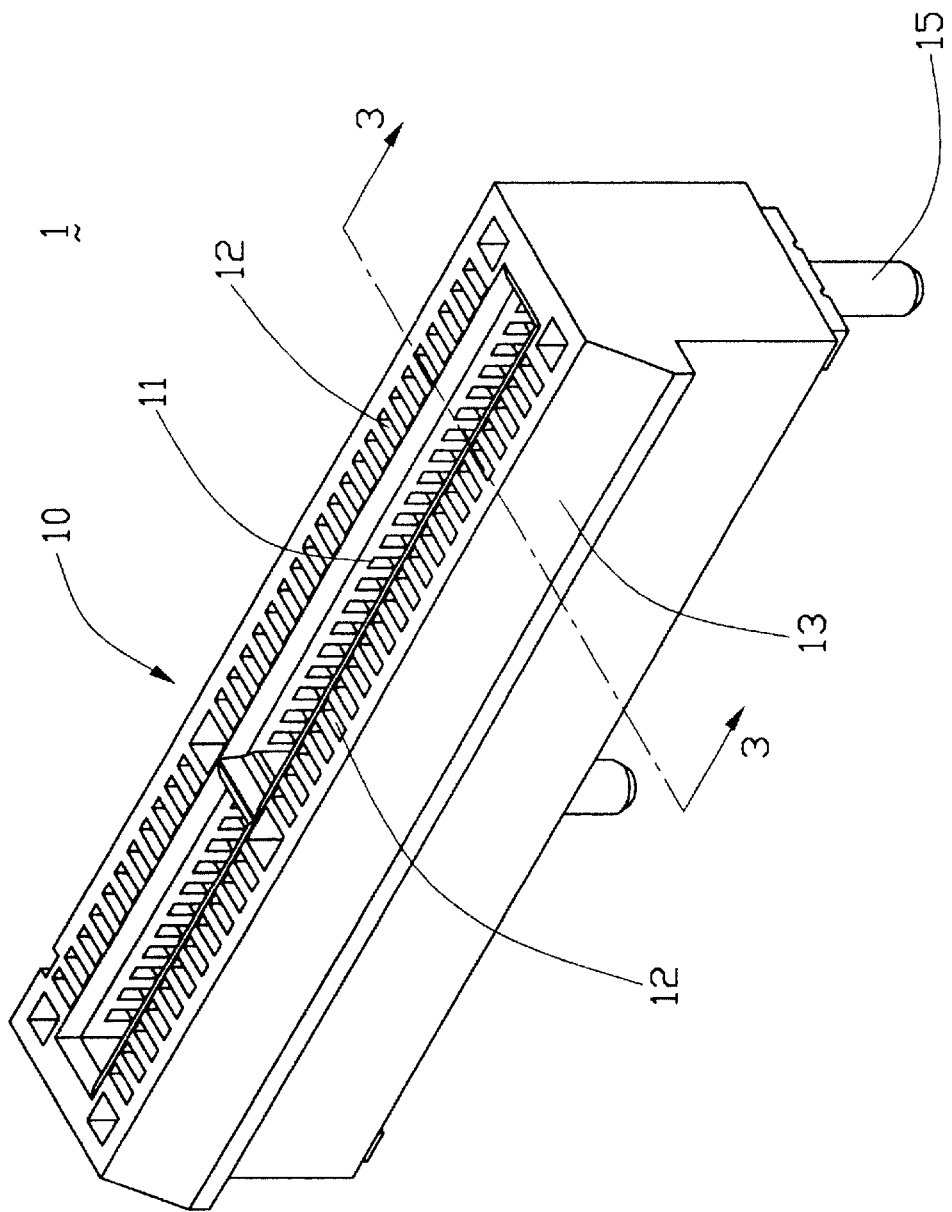
FIG. 1 is a perspective view of an electrical connector in accordance with the present invention.
Figure 3:
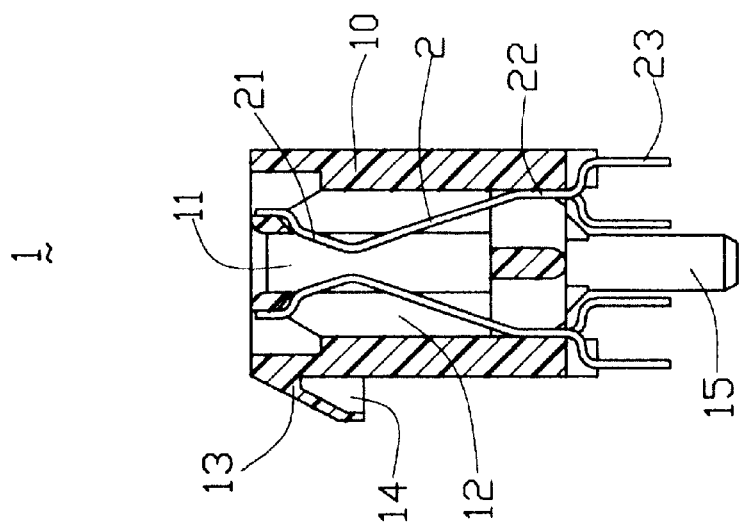
FIG. 3 is a sectional view of the electrical connector showing signal conductors installed therein along the 3—3 line in FIG. 1.
Figure 2:
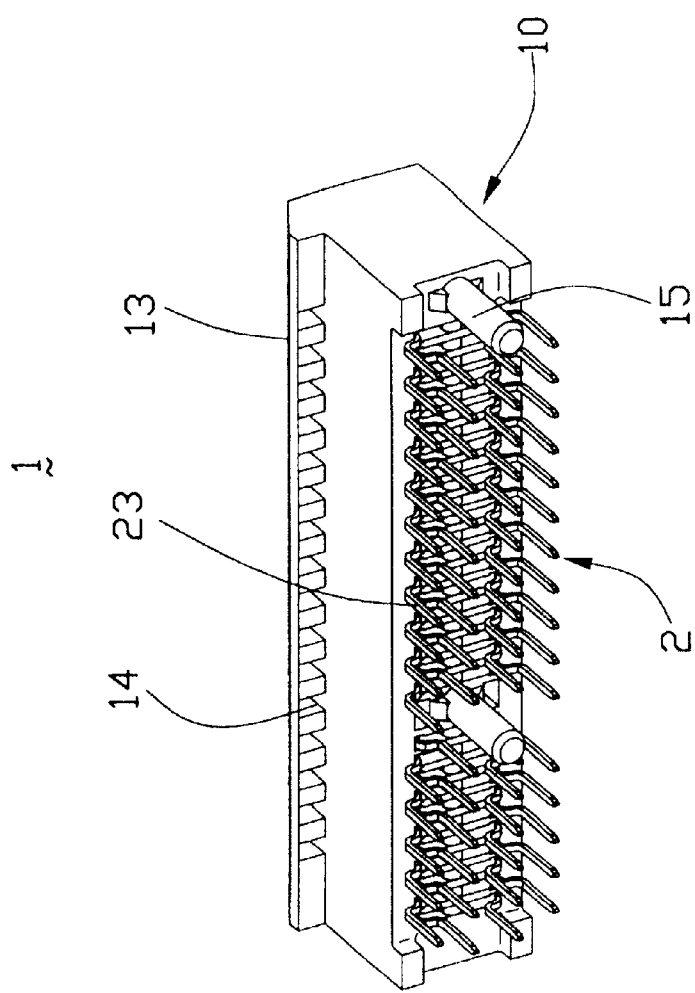
FIG. 2 is another perspective view of the electrical connector as shown in FIG. 1 in accordance with the present invention from a different viewpoint showing the bottom side of the connector housing.
Figure 4:
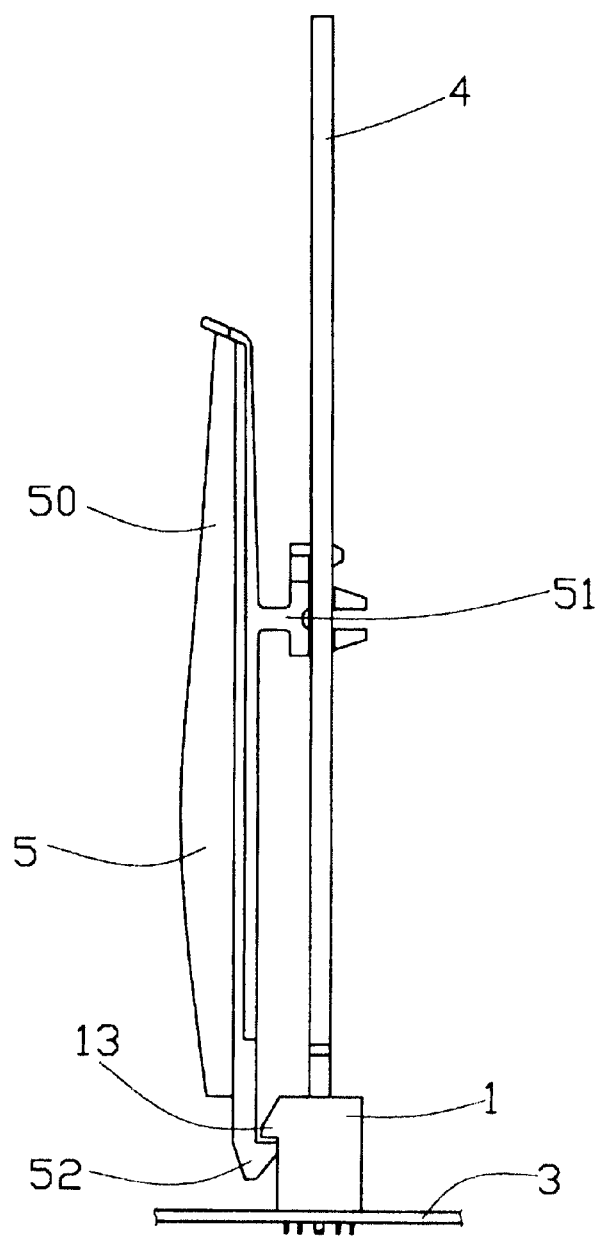
FIG. 4 is a side view of an arrangement of board connection showing an extension daughter card mated with the electrical connector as shown in FIG. 1 is fixed by a retention clip.
Figure 5:
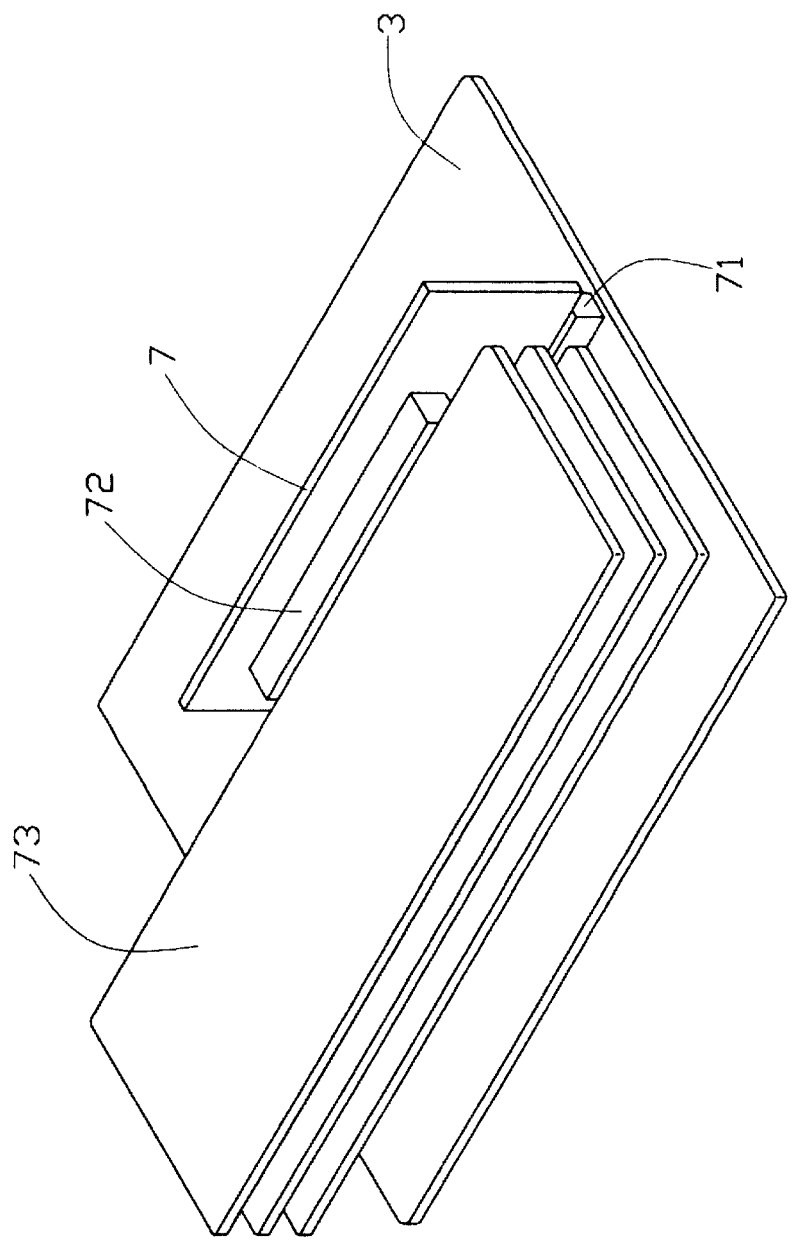
FIG. 5 is a perspective view of another arrangement of board connection showing a riser card is used to connect with some extension daughter cards.
Figure 6:
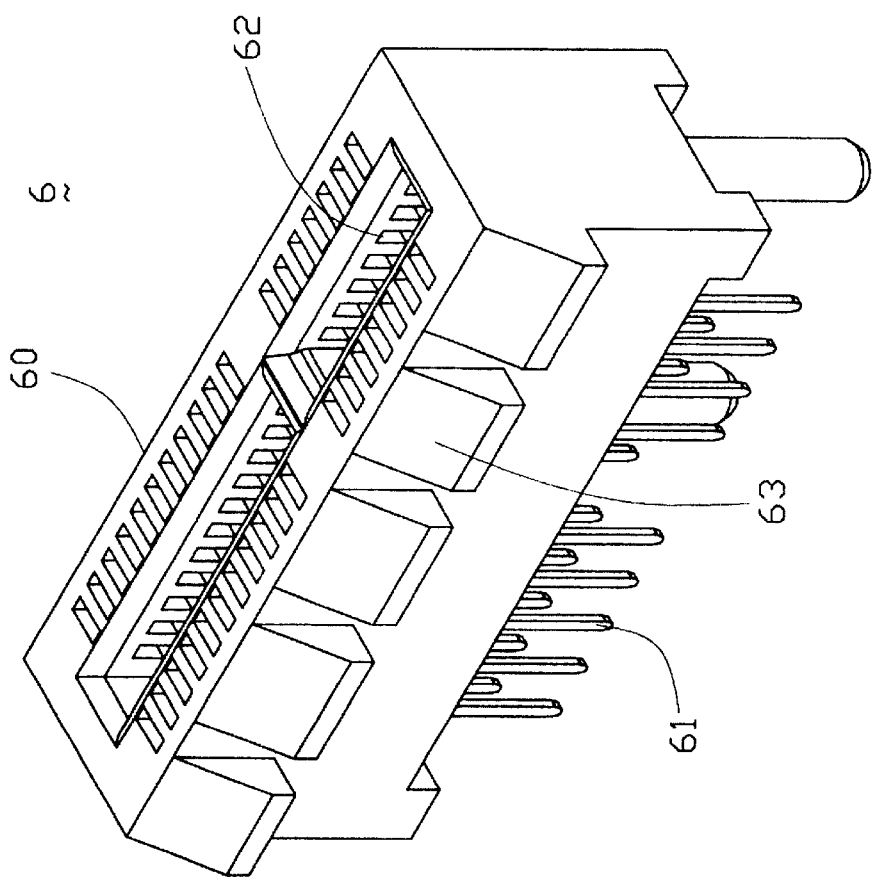
FIG. 6 is a perspective view of a prior-art electrical connector showing serrations formed on one side of the connector housing.

Referring to FIGS. 1 to 3, the electrical connector 1 in accordance with the present invention comprises an elongated parallelepiped housing 10 and a mating groove 11 formed on one surface of the housing 10 to receive a leading edge of a card 4 (as shown in FIG. 4) so as to electrically connect the card 4 to a printed circuit board 3 (as shown in FIG. 4) where the connector 1 is seated. A plurality of passageways 12 is formed in two sidewalls of the mating groove 11 and these passageways 12 are arranged in a row inside every sidewall respectively. Each passageway 12 extends throughout the sidewall where it is located and has two end openings formed on the surface having the mating groove 11 and it opposing surface. And a slot is used for each passageway 12 to communicate with the mating groove 11. Signal conductors 2 with the same number as the passageways 12 are installed into the passageways 12 respectively. Each signal conductor 2 has an engaging portion 22 in the middle of the conductor 2 to fix the conductor 2 in its corresponding passageway 12, a resilient contacting portion 21 extending from the engaging portion 22 toward one opening of the passageway 12 to have its middle section flexibly projecting out of the slot communicating with the groove 11 and staying therein for the possible electrical connection between the connector 1 and the card 4, and a tail portion 23 extending out of the other opening of the passageway for a through-hole connection with soldering to the printed circuit board 3. A ridge-shaped support mechanism 13 with a triangular section projects from one side surface of the housing 10 and is located abutting against one lengthwise edge of the surface having the mating groove 11. A plurality of recesses 14 in a row is formed inside the support mechanism 13 and opened toward the surface opposing to the surface having the mating groove 11. Besides, at least two posts 15 protrude from the opposing surface near the tail portions 23 of signal conductors 2 so as to temporarily hold the whole connector 1 in position before soldering the signal conductors 2.

Referring particularly to FIG. 4, the extension daughter card 4 can connect to the connector 1 after the connector 1 is electrically surface mounted on the printed circuit board 3. A retention clip 5 having a holding post 51 extending from an upright standing body 50 of the clip 5 is attached to the card 4 in advance by using its post 51 inserted into and through a hole (not shown) defined on the card 4. A hook-shaped edge 52 is formed at the bottom of the body 50. When the leading edge of the card 4 is inserted into the mating groove 11 of the connector and electrically connected with signal conductors therein, the edge 52 of the clip 5 can be latched on the ridge-shaped support mechanism 13 of the connector housing 10 to fix the card 4 onto the connector 1 at the same time. It is understandable, however, the bottom edge 52 of the clip 5 can be hooked on any portion of the support mechanism 13 along the connector 1 due to the continuous extension of the support mechanism 13 along the whole length of the connector housing 10. The size of the card 4 or the setting position of the hole on the card 4 then can be flexible and changeable for design of the card 4 because the retention force provided to support the card 4 by the clip 5 will be always available and sufficient. And the size or width of the clip 5 can be changeable and flexible too because the clip 5 can be latched on the connector 1 regardless of the location where the clip 5 falls along the length of the connector housing 10.

Comparing to the design of the related arts, the strength of the support mechanism 13 of the connector 1 in accordance with the present invention is good enough because of its continuously formed shape. And the sidewall the support mechanism 13 is attached to will not become easily warped in the forming process because the recesses 14 inside the support mechanism 13 is going to disturb the possibly uniform fiber arrangement during the cooling-down processing of the housing material.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly comprising:

a printed circuit board;

an elongated housing vertically mounted on the printed circuit board and defining a mating slot along a longitudinal direction thereof;

an elongated support mechanism formed along a top edge of a side wall of the housing;

a plurality of contacts disposed in the housing by two sides of the mating slot;

a daughter board inserted into the mating slot; and a clip attached to the housing and including a holding post locked to the daughter board, and a hook extended at one end of the clip for locking to a downward abutment face of the support mechanism; wherein said support mechanism defines an upward tapered face for compliance with a downward tapered surface of the hook during assembling the clip to the housing, and said upward tapered face extends uninterruptedly along said longitudinal direction while a plurality of recesses are spatially arranged in said support mechanism along said longitudinal direction and communicating to an exterior through said abutment face.

* * * * *